(12) United States Patent
Taniguchi

(10) Patent No.: US 6,994,938 B2
(45) Date of Patent: Feb. 7, 2006

(54) EXPOSURE METHOD FOR PRODUCING A HOLOGRAM MASK

(75) Inventor: Yukio Taniguchi, Yokohama (JP)

(73) Assignee: Kabushiki Kaisha Ekisho Sentan Gijutsu Kaihatsu Center, Yokohama (JP)

( * ) Notice: Subject to any disclaimer, the term of this patent is extended or adjusted under 35 U.S.C. 154(b) by 26 days.

(21) Appl. No.: 10/269,205

(22) Filed: Oct. 10, 2002

(65) Prior Publication Data

US 2003/0124437 A1    Jul. 3, 2003

(30) Foreign Application Priority Data

Dec. 27, 2001    (JP)    ............................. 2001-397021

(51) Int. Cl.
  *G03H 1/28*    (2006.01)
(52) U.S. Cl. ..................... 430/1; 430/2; 359/22; 359/24
(58) Field of Classification Search .................... 430/1, 430/2; 359/22, 24
  See application file for complete search history.

(56) References Cited

U.S. PATENT DOCUMENTS

| | | | | |
|---|---|---|---|---|
| 3,537,854 A | * | 11/1970 | Grobin, Jr. et al. ............. | 430/1 |
| 3,614,426 A | * | 10/1971 | Donzelle ..................... | 378/23 |
| 3,642,472 A | * | 2/1972 | Mayo ........................... | 430/1 |
| 3,712,813 A | * | 1/1973 | Ross et al. ..................... | 430/1 |
| 3,715,164 A | * | 2/1973 | Heflinger ..................... | 356/457 |
| 3,848,096 A | * | 11/1974 | Marko ........................ | 369/103 |
| 3,894,787 A | * | 7/1975 | Leith et al. ................... | 359/24 |
| 4,212,536 A | * | 7/1980 | Bencze et al. ................ | 356/71 |
| 5,187,372 A | * | 2/1993 | Clube ........................ | 250/548 |
| 5,322,747 A | * | 6/1994 | Hugle ........................ | 430/1 |
| 5,719,691 A | * | 2/1998 | Curtis et al. .................. | 359/11 |
| 5,943,145 A | * | 8/1999 | Curtis et al. .................. | 359/22 |

FOREIGN PATENT DOCUMENTS

GB        2140170        * 11/1984

* cited by examiner

*Primary Examiner*—Martin Angebranndt
(74) *Attorney, Agent, or Firm*—Graybeal Jackson Haley LLP

(57) ABSTRACT

Methods for producing a hologram mask approximating the exposure produced by a non-holographic phase shifting photo mask are disclosed. One such method exposes a hologram recording material to a first object light, having passed through a first original mask and a first reference light having a difference in phase with the first object light, and further exposing the hologram recording material to a second object light, having passed through a second original mask and a second reference light having a difference in phase with the second object light, wherein first and second phase differences are not the same and wherein the exposed hologram material can be replayed to produce an exposed pattern that approximates an exposed pattern of a non-holographic phase shifting photomask.

8 Claims, 5 Drawing Sheets

EXPOSURE METHOD FOR PRODUCING A HOLOGRAM MASK

BACKGROUND OF THE INVENTION

1. Field of the Invention

The present invention relates to an exposure method for producing a hologram mask for exposure to be used in a photolithography process in manufacture of a semiconductor integrated circuit, a liquid crystal display and the like.

2. Description of Related Art

There is a recording method using a phase shift mask, which has a phase-modulation layer called phase shifter, in order to solve an inconvenience that, in a recording method for imaging an exposure pattern of a mask for exposure directly on an object by proximity exposure, lens projection exposure, mirror projection exposure, or the like, resolution of an exposure pattern having a line width of about the same degree of the wavelength of an exposure light is difficult due to a diffraction phenomenon of light (so-called diffraction limit).

In the recording method using such a phase shift mask, if a phase shifter is formed, for example, in one of two close light transmitting portions formed in a phase shift mask to make the phases of lights having transmitted both the light transmitting portions reversed to each other, the diffracted lights are cancelled by each other due to interference with each other in opposite phases, so that the diffraction limit is alleviated to improve the resolution of image formed on the object.

However, in the recording method using a phase shift mask, a lens optical system is used as an imaging optical system, which influences the aberration and a numerical aperture of the lens optical system to give influence on the resolution of an image, thus restricting the resolution of a finally obtained image.

In order to solve such an inconvenience as the resolution of the image is restricted due to the aberration and the numerical aperture of the lens optical system for image-formation, there is proposed a method of forming a pattern having information of an exposure pattern of a phase shift mask, by using a hologram mask with an interference fringe including information of an exposure pattern of a phase shift mask formed thereon and irradiating a laser beam on the hologram mask to form a an image of the light having passed the interference fringe of the hologram mask on an object.

In the recording method using such a hologram mask, whether an optical system such as a lens between the hologram mask and the object is provided or not, an image without aberration in principle and an image of high resolution can be obtained, since a high numerical aperture (NA) is apt to be easily obtained.

However, there was such a problem that the hologram mask is produced by recording the information of the phase shift mask to become an original mask in a hologram material, which makes production of the phase shift mask difficult.

SUMMARY OF THE INVENTION

An object of the present invention is to facilitate recording the information of a phase shift mask in a hologram material in production of a hologram mask.

A method for producing a hologram mask approximating the exposure produced by a non-holographic phase shifting photomask comprising: exposing a hologram recording material to a first object light that is at least partially transmitted through a first original mask having a light transmitting screening pattern and a first reference light that is directed onto the hologram recording material wherein a first phase difference exists between the first object light and the first reference light; and exposing the hologram recording material to a second object light that is at least partially transmitted through a second original mask having a light transmitting screening pattern and a second reference light that is directed onto the hologram recording material wherein a second phase difference exists between the second object light and the second reference light, wherein the first phase difference and the second phase difference are not the same, and wherein the first and second original mask images recorded in the hologram recording material can be simultaneously replayed to produce an exposed pattern approximating an exposed pattern of a non-holographic phase shifting photomask.

According to such a method of exposure for producing a hologram mask, information to be recorded in a hologram material in a first exposure step includes information on a light transmitting-screening pattern of a first original mask, while information to be recorded in a hologram material in a second exposure step includes information on a light transmitting-screening pattern of a second original mask as well as modulation information relative to a phase.

Assuming that, for example, a pattern relative to light transmitting-screening of an exposure pattern of a phase shift mask is properly allocated to the first original mask and the second original mask, and that in the second exposure step, the second phase difference is changed so as to correspond to the phase-modulation information of the phase shift mask, then the information to be recorded in the hologram material in the first exposure step and the information recorded in the hologram material in the second exposure step and containing the modulation information relative to phase are recorded in the hologram material by the two exposures.

Since a pattern including the phase difference of the phase shift mask is allocated as a light transmitting-screening pattern to the first original mask and to the second original mask, the number of required original masks is increased in comparison with when the phase shift mask is used as the original, but there is no need to produce a phase shift mask.

The step to change the phase difference can preferably include a step to change at least one of an optical path length from the light source to the hologram material through the second original mask and an optical path length from the light source to the hologram material not through the second original mask. In such a step to change the phase difference, the phase of the light, whose optical path length is changed, is modulated, and the second phase difference is changed.

The light transmitting-screening pattern could be a pattern including: a plurality of band-like light transmitting portions having a predetermined width dimension and arranged like a striped pattern; and a plurality of band-like light screening portions arranged between the plural light transmitting portions, to make the light transmitting portions of the first original mask correspond to at least a part of an area to be screened by the light screening portions of the second original mask, and to make the difference between the first phase difference and the second phase difference approximately $\pi$. This makes information on a pattern with a spatial frequency reduced by the band-like light transmitting portions and light screening portions alternately arranged like a striped pattern as well as information with two waves in opposite phases to each other is recorded in the hologram material. Such a phase shift mask is generally called "Shibuya-Levenson type."

Further, there may be included a step to change diffraction efficiency which causes a difference between a diffraction efficiency due to a first interference fringe to be formed in the hologram material in the first exposure step and a diffraction efficiency due to a second interference fringe to be formed in the hologram material in the second exposure step. By the exposure method including such a diffraction efficiency changing step, a hologram mask having a function similar to that of a light semi-transmissive phase shifter of a phase shift mask can be produced. Such a phase shift mask is generally called "halftone type."

The diffraction efficiency changing step may include: a light-intensity reducing step which reduces a light-intensity ratio of an object light to a reference light somewhere from the original mask to the light source to be smaller than a light-intensity ratio necessary to maximize the diffraction efficiency; or an exposure energy adjusting step which adjusts exposure energy given to the hologram material to be smaller than exposure energy necessary to maximize the diffraction efficiency. According to the exposure method including such a light-intensity reducing step or a diffraction efficiency changing step having such an exposure energy adjusting step, it is possible to produce a hologram mask having such a function as that of the phase shifter having various light transmittances of the phase shift mask.

The interference fringe finally formed in the hologram material could be made to include a striped pattern such that band-like light transmitting portions and light semi-transmissive portions respectively having a predetermined width are alternately arranged, that the first original mask and the second original mask have the light screening portions corresponding to the light semi-transmissive portions of the striped pattern of the hologram material, that the light transmitting portions of the first original mask correspond to at least a part of an area to be screened by the light screening portions of the second original mask, that the difference between the first phase difference and the second phase difference is approximately $\pi$, and that a diffraction efficiency changing step to change the diffraction efficiency of the hologram material to be smaller at the light transmittable portions is provided. This enables to produce a hologram mask having such a function as the function of the phase shifter having various light transmittances of the phase shift mask.

In the hologram material, the same photo-sensitive film or photo-sensitive layer to be used in both the first exposure step and the second exposure step may be formed, or different photo-sensitive films or photo-sensitive layers to be used respectively in the first exposure step and the second exposure step may be formed.

The exposure apparatus for producing the hologram mask according to the present invention is an exposure apparatus which uses a plurality of original masks to expose a light transmitting-screening pattern of an optical modulation layer formed in each original mask on the same hologram material and produce a hologram mask having an interference fringe containing modulation information relative to light transmittance and phase, and comprises phase-modulating means for changing a second phase difference at a position in an optical path from a light source to the hologram material, so that, in at least two consecutive exposures, a first phase difference between a first object light to be irradiated on the hologram material through the first original mask in a preceding first exposure and a first reference light to be irradiated on the hologram material not through the first original mask may differ from a second phase difference between a second object light to be irradiated on the hologram material through the second original mask in a second exposure following the first exposure and a second reference light to be irradiated on the hologram material not through the second original mask.

According to the exposure apparatus for producing such a hologram mask, the information to be recorded in the hologram material in the first exposure contains the information of the light transmitting-screening pattern of the first original mask, while the information to be recorded in the hologram material in the second exposure contains the modulation information relative to the information of the light transmitting-screening pattern of the second original mask.

The recording method using the hologram mask according to the present invention is a recording method using a hologram mask comprising: a pre-exposure step for producing a hologram mask having an interference fringe including modulation information relative to light transmittance and phase by using a plurality of original masks to expose the light transmitting-screening pattern of an optical modulation layer formed in each original mask on the same hologram material; and a regular exposure step to record the modulation information on the light transmittance and the phase by irradiation on the hologram mask. The pre-exposure step includes: a mask preparation step to prepare at least the first original mask and the second original mask; a first secondary exposure step to expose the light transmitting-screening pattern of the first original mask on the hologram material by using the first object light to be irradiated on the hologram material through the first original mask; and a second secondary exposure step following the first exposure step, in which a second object light to be irradiated on the hologram material through the second original mask and a second reference light to be irradiated on the hologram material not through the second original mask are used to expose the light transmitting-screening pattern of the second original mask on the hologram material, and in a position in the optical path from the light source to the hologram material, a second phase difference between the second object light and the second reference light is changed so that a first phase difference between the first object light and the first reference light may differ from the second phase difference.

According to the recording method using such a hologram mask, the information to be recorded on the first secondary exposure step contains the information on the light transmitting-screening pattern of the first original mask, which the information to be recorded in the hologram in the second secondary exposure step contains the modulation information relative to the light transmitting-screening pattern of the second original mask and the phase.

If the modulation information relative to the light transmittance and the phase is recorded on an exposed object by using such a hologram mask to irradiate light on the hologram mask to record, resolution of an imaged pattern is improved due to an effect of the phase shift mask.

BRIEF DESCRIPTION OF THE DRAWINGS

FIGS. 2($a$) and 2($b$) are views showing an embodiment of a phase changing device used in the exposure apparatus for producing the hologram mask according to the present invention, in which FIG. 2(a) shows a phase changing device using a corner cube and FIG. 2(b) a phase changing device using a light transmitting member.

FIGS. 3(a), 3(b) and 3(c) are views to explain an embodiment of the exposure method for producing the hologram mask according to the present invention, in which FIG. 3(a) shows a phase shift mask, FIG. 3(b) a first original mask and a hologram material, and FIG. 3(c) a second original mask and a hologram material.

FIGS. 4(a), 4(b) and 4(c) are views to explain another embodiment of the exposure method for producing the hologram mask according to the present invention, in which FIG. 4(a) shows a phase shift mask, FIG. 4(b) a first original mask and a hologram material, and FIG. 4(c) a second original mask and a hologram material.

PREFERRED EMBODIMENTS OF THE INVENTION

The exposure apparatus for producing a hologram mask according to the present invention is explained in the following with reference to FIG. 1. The exposure apparatus shown in FIG. 1 is one embodiment of the apparatus, but another exposure apparatus may be used.

Figure 1:
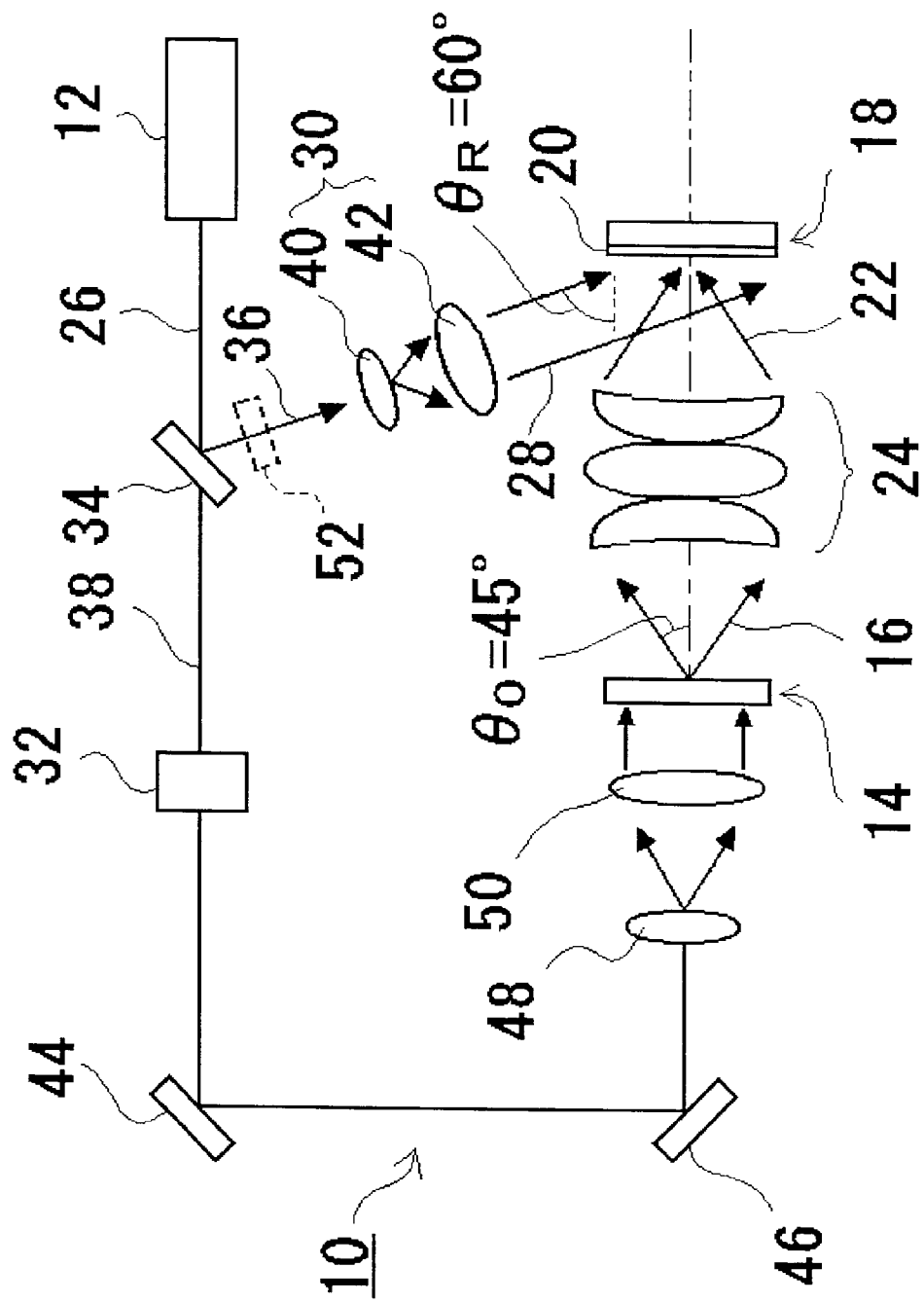
FIG. 1 is a view showing an embodiment of the exposure apparatus for producing a hologram mask according to the present invention.

In FIG. 1, an exposure apparatus 10 comprises: a light source 12; a converging optical system 24 to focus a light 16 introduced from the light source 12 through an original mask 14 as an object light 22 on a sensitized material of a hologram material 18; and a reference light forming optical system 30 which introduces a light 26 from the light source 12 as a reference light 28 not through the original mask 14.

As the light source 12, various kinds of laser having coherence such as Ar laser, Kr laser, YAG laser, can be used.

The original mask 14 includes a light-transmitting mask base and an optical modulation layer having a light transmitting portion and a light screening portion respectively formed in the mask base. The mask base is made, using a glass material excellent in light transmission such as quartz glass. The light screening portion is formed from a metal thin film by a thin film technique. In the embodiment shown in FIG. 1, chromium is employed as the metal thin film material.

As a sensitized material, any material capable of recording as hologram information can be used. For example, a silver halide material, dichromate gelatin, photopolymer for hologram (e.g., Omnidex by trade name) of E. I. Dupont de Nemours & Company in the U.S.A., etc. can be used.

The exposure apparatus 10 further comprises a phase modulator 32 disposed in an optical path from the light source 12 to the sensitized material 20 of the hologram material 18 through the original mask 14. The phase modulator 32 varies the optical path length of one light 38 of lights 36, 38 resulted from a light 26 from the light source 12 split by a beam splitter 34. As a result, the phase difference between the object light 22 and the reference light 28 is changed.

Figure 2:
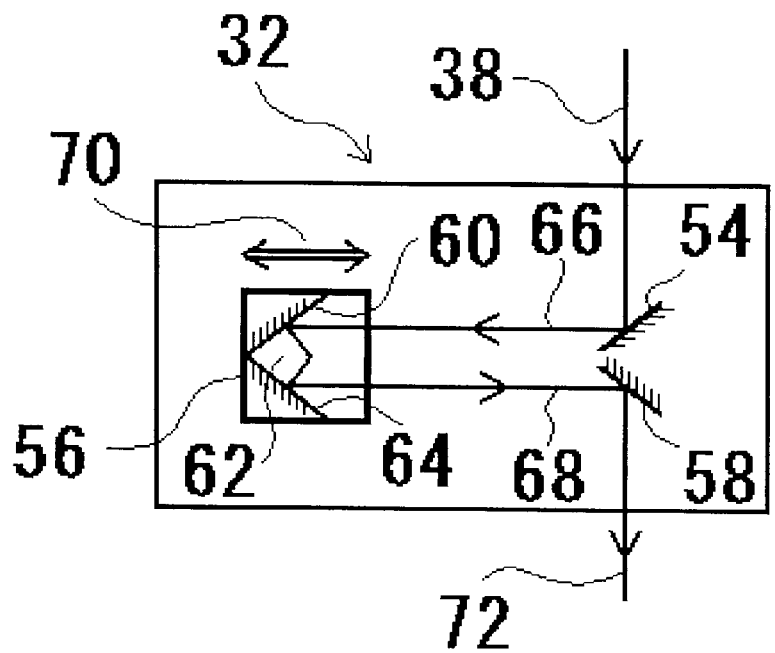
Figure 2:
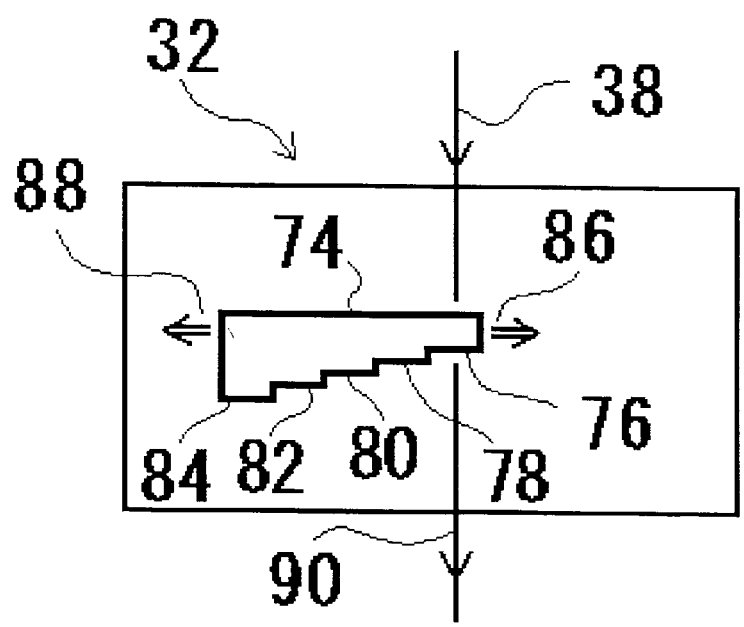

The phase modulators shown in FIGS. 2(a) and 2(b) are two typical examples, and another phase modulator may be used. The phase modulator 32 shown in FIG. 2(a) includes a first reflecting mirror 54, a corner-cube 56, and a second reflecting mirror 58.

The corner-cube 56 has three reflecting surfaces 60, 62, 64 vertical to one another and is formed such that a light 66 entering the corner-cube 56 and a light 68 going out of the corner-cube 56 becomes parallel. The corner-cube 56 is moved by a drive unit (not shown) in the direction of the arrow 70 to be adjusted in position.

The light 38 introduced from the light source 12 (see FIG. 1) enters the phase modulator 32, reflected at the first reflecting mirror 54, and enters the corner-cube 56 as the light 66. The light having entered the corner-cube 56 is reflected at the reflecting surfaces 60, 62, 64 in order and goes out of the corner-cube 56 as the light 68. The light 68 advances parallel to the light 66 having entered the corner-cube 56 in the opposite direction, reflected at the second reflecting mirror 58, and goes out of the phase modulator 32 as a light 72.

By moving the corner cube 56 in the direction of the arrow 70, the optical path length for the light 38 to pass inside the phase modulator 32 can be adjusted freely.

The phase modulator 32 shown in FIG. 2(b) includes a light transmitting member 74 having a refractive index $N_0$ greater than 1. The light transmitting member 74 has surfaces 76, 78, 80, 82 and 84 which change the thickness dimension in the optic axial direction step-wise. The light transmitting member 74 is moved by a drive unit not shown in the direction of arrows 86, 88 and can be adjusted in position.

The light 38 introduced from the light source 12 (see FIG. 1) enters the phase modulator 32 and enters the light transmitting member 74. The light having entered the light transmitting member 74 advances within the light transmitting member 74, goes out of the surface 76 of the light transmitting member 74 and goes out of the phase modulator 32 as a light 90. Since the light transmitting member 74 has a refractive index $N_0$ greater than 1, the optical path length of the light 38 is varied according to the product of the thickness dimension of the position of the light transmitting member 74 through which the light 38 passes and {refractive index $N_0$–1.0 (refractive index of the air)}.

By moving the light transmitting member 74 in the direction of the arrow 86, the surface of the light transmitting member 74 from which the light 38 goes out can be set any one of the surfaces 78, 80, 82 and 84. This enables to change the thickness dimension of the position of the light transmitting member 74 where the light 38 passes and to adjust the optical path length of the light 38.

The phase modulator 32 capable of changing such a phase difference can change the phase difference between the object light and the reference light.

In the following is explained the exposure method for producing the hologram mask according to the present invention with reference to FIG. 1. The light 26 from the light source 12 is split into the lights 36, 38 by the beam splitter 34. The light 36 enters the sensitized material 20 of the hologram material 18 as the reference light 28 through the reference light forming optical system 30 including lenses 40, 42.

The light 38 enters the original mask 14 through the phase modulator 32, mirrors 44, 46 and lenses 48, 50. The light having transmitted the original mask 14 is converged as the object light 22 by a converging optical system 24 and imaged on the sensitized material 20 of the hologram material 18 or in its vicinity.

Thus, the two lights, that is, the object light 22 through the original mask 14 and the converging optical system 24 and the reference light 28 not through the original mask 14 interfering with each other on the sensitized material 20 or in its vicinity, the light transmitting-screening pattern of the original mask 14 is recorded on the sensitized material 20 of the hologram material 18 as the information on an interference fringe.

In exposure, a plurality of original masks 14 are used, and the light transmitting-screening pattern of the optical modulation layer formed in each original mask 14 is exposed on the sensitized material 20 of the same hologram material 18, thereby to produce the hologram material 18 in which an interference fringe containing modulation information relative to the light transmittance and the phase is formed.

In the first exposure, the light transmitting-screening pattern of the first original mask 14 is exposed on the sensitized material 20 by using the first object light 22 to be irradiated on the sensitized material 20 through the first original mask 14 and the first reference light 28 to be irradiated on the sensitized material 20 not through the first original mask 14.

In the first exposure, the phase modulator 32 is in a certain state, which determines the phase difference between the object light and the reference light in the first exposure.

In the first exposure, a latent image is formed in the area of the sensitized material 20 where the light was irradiated by exposure.

In the second exposure following the first exposure, the second object light 22 to be irradiated on the sensitized material 20 through the second original mask 14 and the second reference light 28 to be irradiated on the sensitized material 20 not through the second original mask 14 are used, to expose the light transmitting-screening pattern of the second original mask 14 on the sensitized material 20.

Before the second exposure, the phase modulator 32 is actuated to change the optical path length of the light 38 which passed the beam splitter 34 from the light source 12 to change the second phase difference so that the first phase difference between the first object light 22 and the reference light 28 may differ from the second phase difference between the second object light 22 and the second reference light 28.

Consequently, in the second exposure, the light whose optical path length is changed enters the second original mask 14 to become the second object light and enters the sensitized material 20. Namely, the phase difference between the second object light 22 and the second reference light 28 differs from the phase difference between the first object light 22 and the first reference light 28 according to the change in the optical path length caused in the optical path length from the light source 12 to the sensitized material 20 through the second original mask 14.

The information to be recorded in the sensitized material 20 in the first exposure contains the information on the light transmitting-screening pattern of the first original mask 14, while the information to be recorded in the sensitized material 20 in the second exposure contains the modulation information on the light transmitting-screening pattern information of the second original mask 14 and the phase. The information to be recorded in the sensitized material 20 in the first exposure and the information to be recorded in the sensitized material 20 in the second exposure and containing the modulation information on the phase are recorded in the sensitized material 20 by the two exposures.

As mentioned above, by using a plurality of original masks, the same information as the information of the phase shift mask can be recorded in the hologram material, i.e., the sensitized material 20 without necessitating production of the phase shift mask which is hard to produce.

The phase modulator 32 for changing the phase difference is disposed in the optical path from the light source 12 to the sensitized material 20 of the hologram material 18 through the original mask 14, but may be disposed, for example, at the position indicated by the numeral 52 in FIG. 1 in the optical path from the light source 12 to the sensitized material 20 of the hologram material 18 not through the original mask 14.

It is also possible to dispose the phase modulator 32 in each of the optical path from the light source 12 to the sensitized material 20 through the original mask 14 and the optical path from the light source 12 to the sensitized material 20 not through the second original mask 14.

Further, in order to make the diffraction efficiency due to the interference fringe to be formed in the sensitized material 20 in the first exposure differ from the diffraction efficiency due to the interference fringe to be formed in the sensitized material 20 in the second exposure, it is possible to provide a light intensity reducer for reducing the light intensity ratio of the object light 22 to the reference light 28 somewhere from the original mask 14 to the light source 12 such that the light intensity ratio differs in the first exposure and in the second exposure.

The light intensity reducer may be provided with an exposure energy adjuster for adjusting the exposure energy given to the sensitized material 20 so that the exposure energy given to the sensitized material 20 may become smaller than the exposure energy required for maximizing the diffraction efficiency due to the interference fringe to be formed in the sensitized material 20.

The sensitized material 20 may be formed with one photosensitive film or a photosensitive layer used in common for the first exposure and the second exposure. Also, the sensitized material 20 may be formed with photosensitive films or photosensitive layers different in layer to be used respectively for the first exposure and the second exposure.

In production of the hologram mask, various devices can be adopted besides the above-mentioned devices. For example, there are producing devices such as one based on the principle described in "Holography" by Jumpei Tsujiuchi, published as Selected Book of Physics 22 (1997) by Shokabo-sha, pp. 354–358, those based on the methods described in the specifications of U.S. Pat. No. 4,857,425, U.S. Pat. No. 4,966,428, etc. According to the latter, a lens system is not necessarily provided between a hologram material and an original mask.

Also, a hologram mask can be produced by using exposure devices, "HMA series," made by Holtronic Technologies Limited in London, England, the applicant of the foregoing U.S. patents.

In the following is concretely explained a case of producing a hologram mask having a similar function to that of the Shibuya-Levenson type phase shift mask.

Figure 3:
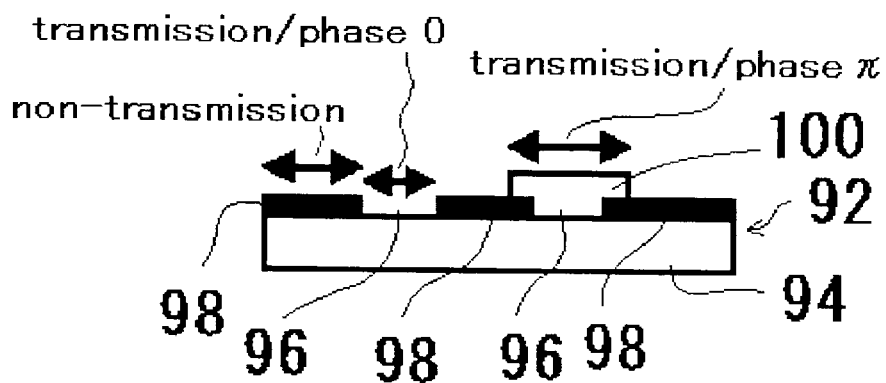
Figure 3:
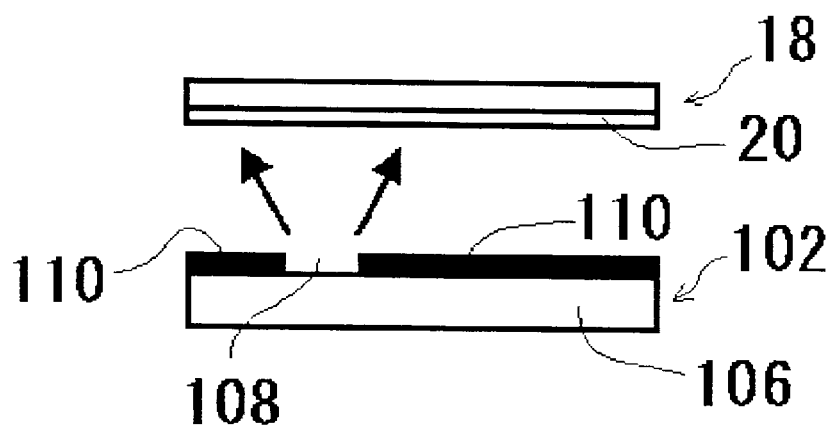
Figure 3:
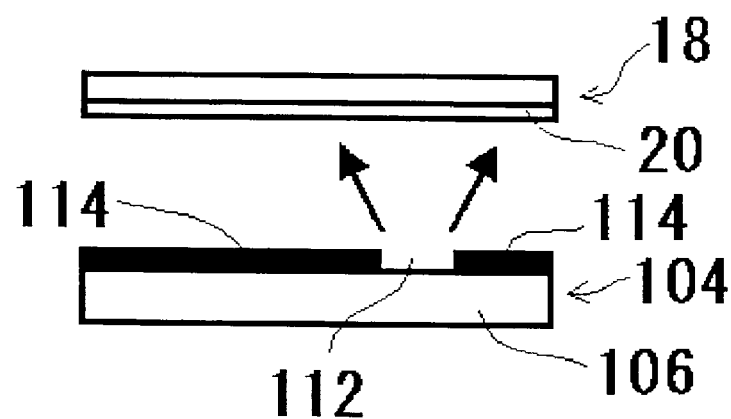

The Shibuya-Levenson type phase shift mask 92 comprises, as shown in FIG. 3($a$), a mask base 94, a light transmitting portion 96, a light screening portion 98, and a phase shifter 100. The phase shifter 100 is formed in part of the light transmitting portion 96. Suppose the phase of a light through the light transmitting portion 96 which has no phase shifter 100 is a standard (phase 0), a light through the light transmitting portion 96 which has the phase shifter 100 is changed by $\pi$ in phase (phase $\pi$).

In order to produce a hologram mask having such a function as that of the Shibuya-Levenson type phase shift mask 92 by a double-exposure method, using two original masks, a first original mask 102 shown in FIG. 3($b$) and a second original mask 104 shown in FIG. 3($c$) are used.

The first original mask 102 includes a mask base 106, a light transmitting portion 108, and a light screening portion 110. The light transmitting portion 108 of the first original mask 102 corresponds at least to a part of the area to be screened by a light screening portion 114 of the second original mask 104.

In the embodiment shown in FIGS. 3(a), 3(b) and 3(c), the light transmitting portions 108, 112 are formed like bands having a predetermined width and arranged like a striped pattern, and one or more light screening portions 110, 114 are formed like bands and arranged between the plural light transmitting portions 108, 112.

In the first exposure using the first original mask 102, the light transmitting-screening pattern of the first original mask 102 including the light transmitting portion 108 which is to become the area of transmittance and the phase 0 corresponding to the light transmitting portion 96 of the phase shift mask 92 is exposed on the sensitized material 20 of the hologram material 18.

Then, in the second exposure using the second original mask 104, the light transmitting-screening pattern of the second original mask 104 including the light transmitting portion 112 which is to become the area of the transmittance and the phase $\pi$ corresponding to the light transmitting portion 96 which has the phase shifter 100 of the phase shift mask 92 is exposed on the sensitized material 20 of the hologram material 18. In the second exposure, the optical path length is changed by the phase modulator 32 so that the phase of a light entering the light transmitting portion 112 may be delayed by $\pi$ in comparison with the first exposure.

The phase difference between the object light and the reference light in the second exposure is changed by the phase modulator 32, and the information to be recorded in the sensitized material 20 in the second exposure contains the phase-modulation information.

As another concrete example, a case of producing a hologram mask having a similar function to that of a halftone phase shift mask as a hologram mask is explained in the following. In an exposure device used for producing such a hologram mask, as mentioned later, a light intensity reducer (not shown) for reducing a light intensity ratio is disposed somewhere from the original mask to the light source.

Figure 4:
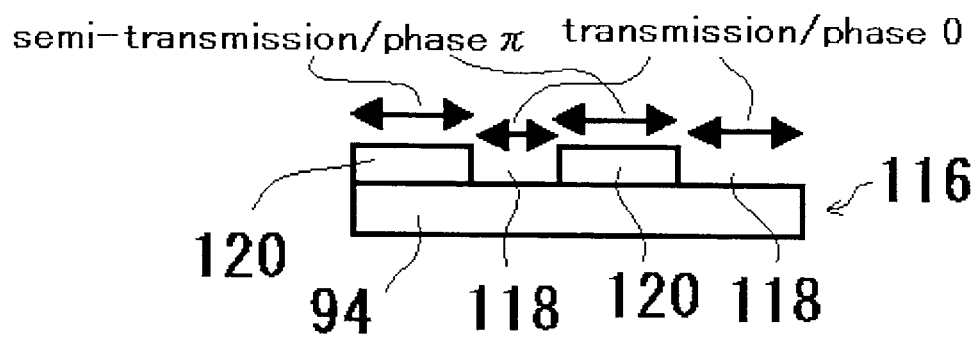
Figure 4:
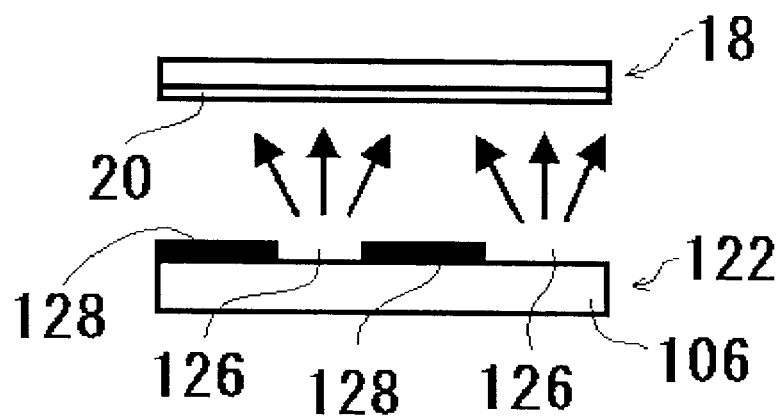
Figure 4:
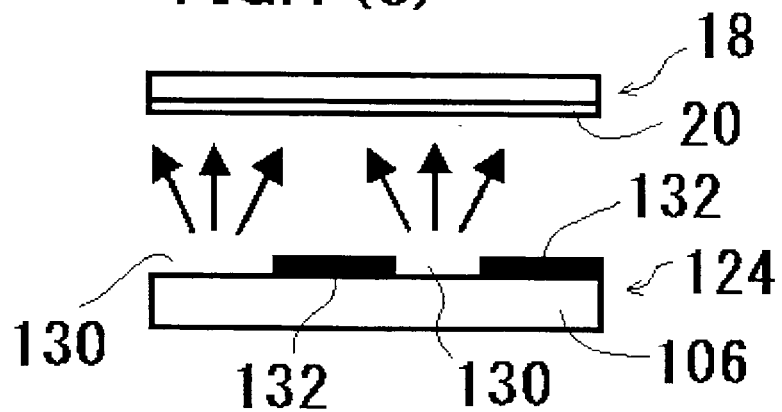

A halftone-type phase shift mask 116 comprises, as shown in FIG. 4(a), a mask base 94, a light transmitting portion 118, and a phase shifter 120. The phase shifter 120 is formed by using a light semi-transmitting material having a predetermined transmittance. Suppose the phase of a light through the light transmitting portion 118 is a standard (phase 0), the light through the phase shifter 120 is changed by $\pi$ in phase (phase $\pi$).

To produce a hologram mask having such a function as that of the halftone-type phase shift mask 116 by the double-exposure method using two original masks, the first original mask 122 shown in FIG. 4(b) and the second original mask 124 shown in FIG. 4(c) are used.

The first original mask 122 includes a mask base 106, a light transmitting portion 126, and a light screening portion 128. The second original mask 124 includes a mask base 106, a light transmitting portion 130, and a light screening portion 132. The light transmitting portion 126 of the first original mask 122 corresponds at least to a part of the area to be screened by the light screening portion 132 of the second original mask 124.

In the embodiment shown in FIGS. 4(a), 4(b) and 4(c), the interference fringe finally formed in the sensitized material 20 of the hologram material 18 includes a striped pattern in which band-like light transmitting portions having a predetermined width dimension and light semi-transmissive portions are arranged alternately. The light screening portion 128 of the first original mask 122 corresponds to the light semi-transmitting portions of the striped pattern of the sensitized material 20, while the light screening portions 132 of the second original mask 124 correspond to the light transmitting portions of the striped pattern of the sensitized material 20.

The light transmitting portion 126 of the first original mask 122 corresponds at least to a part of the area to be screened by the light screening portion 132 of the second original mask 124.

In the first exposure using the first original mask 122, the light transmitting-screening pattern of the first original mask 122 including the light transmitting portion 126 which is to become the area of the transmittance and the phase 0 corresponding to the light transmitting portion 118 of the phase shift mask 116 is exposed on the sensitized material 20.

Then, in the second exposure using the second original mask 124, the light transmitting-screening pattern of the second original mask 124 including the light transmitting portion 130 which is to be the area of semi-transmitting and the phase $\pi$ corresponding to the light semi-transmitting phase shifter 120 of the phase shift mask 116 is exposed on the sensitized material 20. In the second exposure, the optical path length is changed by the phase modulator 32 so that the phase of a light entering the light transmitting portion 130 may be delayed by $\pi$ in comparison with the first exposure.

Also, in the second exposure, the light intensity ratio is reduced by a light intensity reducer (not shown) disposed somewhere from the second original mask 124 to the light source 12 of the exposure device.

As the light intensity reducer, for example, a light absorbing filter device can be used. Such a light absorbing filter device may be one which reduces the intensity of passing light, as an example, by providing a plurality of light absorbing filters beforehand, and moving any or at least one of the light absorbing filters properly to the optical path.

By such a light intensity reducer, the light intensity ratio of the second object light to the second reference light is reduced so that the diffraction efficiency due to the interference fringe to be formed in the sensitized material 20 in the first exposure and the diffraction efficiency due to the interference fringe to be formed in the sensitized material 20 in the second exposure may be different.

It is also possible to reduce the light intensity ratio by adjusting the exposure energy to be given to the sensitized material 20 so that the exposure energy to be given to the sensitized material 20 of the hologram material 18 may become smaller than the exposure energy required for maximizing the diffraction efficiency. The adjustment of the exposure energy to be given to the sensitized material 20 can be performed by adjusting the exposure time and the light intensity from the light source.

In the following is explained a method of recording modulation information on the light transmittance and the phase by light irradiation on the hologram mask by using such a hologram mask as mentioned above.

Figure 5:
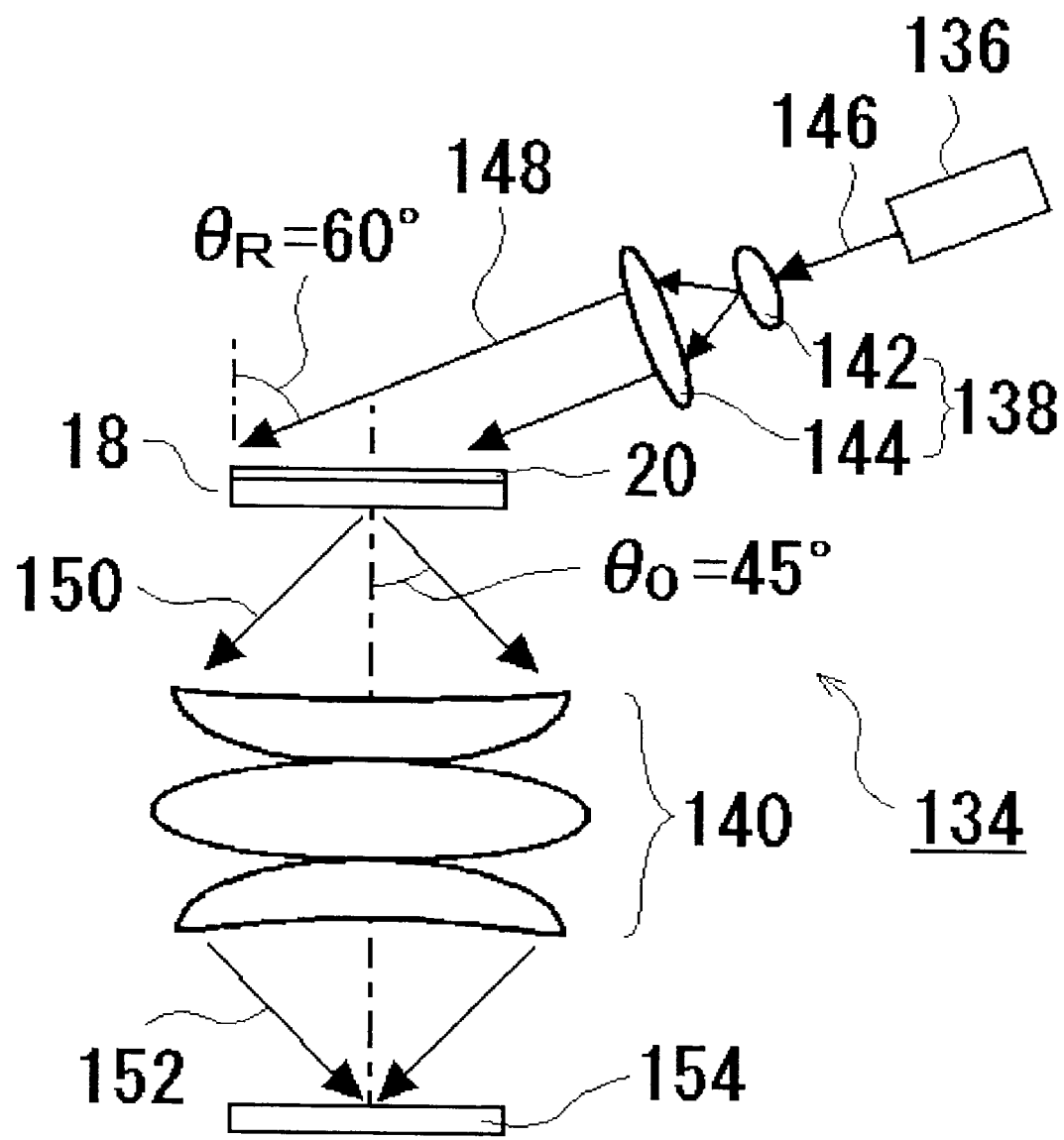
FIG. 5 is a view showing one example of a recorder to be used in an embodiment of the recording method using the hologram mask according to the present invention.

The recorder 134 shown in FIG. 5 is an embodiment of the recorder to be used in the method of recording using a hologram mask according to the present invention, but another recorder may be employed. The recorder 134 may employ an optical system similar to that used in the exposure device 10 in FIG. 1.

The recorder 134 comprises a light source 136, an irradiation optical system 138, and a converging optical system 140.

The irradiation optical system 138, including lenses 142, 144, converts a light 146 from the light source 136 into a parallel beam 148 and introduces it to the sensitized material 20 of the hologram mask 18. The irradiation optical system 138 is disposed in the recorder 134 so that the parallel beam 148 may be directed opposite to the reference light 28 at the time of recording of the hologram mask.

The converging optical system 140 converts a light 150 through the hologram mask 18 into a light 152, converges it at an exposed object 154, and images on the exposed object 154. As the converging optical system 140, the same one as the optical system 24 at the time of recording of the hologram mask is used.

The term "exposed object" includes a "semiconductor base plate on which a resist layer is formed." Here, the term "semiconductor base plate" is used to mean a "base material on which a laminated layer is formed," so that it includes a case that a base material is glass or the like. Also, at least the term "base material" is used to mean a "base material of circular, rectangular or other shapes formed from a semiconductor or glass, etc., and the term "laminated area" is used to mean an area of a laminar material formed on the base material, including, for example, a conductive layer of wiring, electrodes and the like, a layer of electrically insulated materials, a layer of a light selecting material, and a semiconductor layer, etc.

Further, the "exposed object may be a base plate with a light selecting material for selecting a specific wavelength layered for bringing about special illumination effect, and it can be variously modified without departing from its spirit.

In case of recording in the exposed object the information recorded in the sensitized material 20 of the hologram mask 18, the light 146 from the light source 136 enters the sensitized material 20 of the hologram mask 18 through the irradiation optical system including the lenses 142, 144, and the light 150 through the hologram mask 18 is imaged on the exposed object 154 by the converging optical system 140.

At this time, since the same information as that of the phase shift mask has been recorded in the hologram material or the sensitized material 20, the resolution of the pattern to be imaged is improved we well as the effect of the phase shift mask.

In the following is given explanation about the optical characteristic in the double exposure method such as mentioned above. A comparison between such a double exposure method and a single exposure method using the phase shift mask is also explained.

Suppose the amplitude distribution of an object light A formed through the first original mask to be used in the first exposure is $P_A$, the complex amplitude distribution $G_A$ of the light immediately before entering the hologram material or the sensitized material can be obtained by expression (1) as shown below.

[Formula 1]
$$G_A = P_A \times \exp[i\alpha] \tag{1}$$

Here, α represents the phase of the object light A.

Suppose the amplitude distribution of a reference light R1 to be used in the first exposure is $P_{R1}$, the complex amplitude distribution $G_{R1}$ of the light immediately before entering the hologram material can be obtained by expression (2) as shown below. $\gamma_1$ represents the phase of the reference light R1.

[Formula 2]
$$G_{R1} = P_{R1} \times \exp[i\gamma_1] \tag{2}$$

Suppose the amplitude distribution of an object light B formed through the second original mask to be used in the second exposure is $P_B$, the complex amplitude distribution $G_B$ of the light immediately before entering the sensitized material can be obtained by expression (3) as shown below. β represents the phase of the object light B.

[Formula 3]
$$G_B = P_B \times \exp[i\beta] \tag{3}$$

Suppose the amplitude distribution of a reference light R2 to be used in the second exposure is $P_{R2}$, the complex amplitude distribution $G_{R2}$ of the light immediately before entering the hologram material can be obtained by expression (4) as shown below. $\gamma_2$ represents the phase of the reference light R2.

[Formula 4]
$$G_{R2} = P_{R2} \times \exp[i\gamma_2] \tag{4}$$

Accordingly, a light intensity $I_{2AB}$ given to the sensitized material by the first exposure and the second exposure can be obtained by expression (5) as shown below.

[Formula 5]
$$\begin{aligned} I_{2AB} &= |G_A + G_{R1}|^2 + |G_B + G_{R2}|^2 \\ &= |G_A|^2 + |G_{R1}|^2 + G_A \times G_{R1}^* + G_A^* \times G_{R1} + \\ &\quad |G_B|^2 + |G_{R2}|^2 + G_B \times G_{R2}^* + G_B^* \times G_{R2} \end{aligned} \tag{5}$$

Here, $G_A^*$, $G_B^*$, $G_{R1}^*$, and $G_{R2}^*$ respectively represent the conjugate complex numbers of $G_A$, $G_B$, $G_{R1}$, and $G_{R2}$.

Should the same reference light R be used for the reference light R1 to be used in the first exposure and the reference light R2 to be used in the second exposure, $G_{R1} = G_{R2} = G_R$ is established, and expression (5) can be rewritten like expression (6) below.

[Formula 6]
$$\begin{aligned} I_{2AB} &= |G_A + G_R|^2 + |G_B + G_R|^2 \\ &= |G_A|^2 + |G_B|^2 + 2 \times |G_R|^2 + G_A \times G_R^* + \\ &\quad G_A^* \times G_R + G_B \times G_R^* + G_B^* \times G_R \end{aligned} \tag{6}$$

Here, suppose the amplitude distribution of the reference light R is $P_R$, the complex amplitude distribution $G_R$ of the light immediately before entering the sensitized material can be obtained by expression (7) as shown below. γ represents the phase of the reference light R.

[Formula 7]
$$G_R = P_R \times \exp[i\gamma] \tag{7}$$

After the second exposure, the sensitized material of the hologram mask is developed. In case of using as the sensitized material such as a silver halide material in which an intensity distribution is recorded as a transmittance distribution, the amplitude transmittance distribution $T_{2AB}$ recorded in the sensitized material can be obtained by expression (8) as shown below.

[Formula 8]

$$T_{2AB} = T_0 + t_1 \times I_{2AB} \quad (8)$$

Here, $T_0$, $t_1$ are fixed numbers determined according to the kind of a sensitized material to be used and a method of recording in the sensitized material.

After developing, the information recorded in the sensitized material is recorded in the exposed object. In case of using the above-mentioned reference light R as a light introduced from the light source and entering the sensitized material or an illumination light $R_L$, a light to be irradiated on the exposed object or a regenerated light S can be obtained by expression (9) as shown below by using expressions (6), (7) and (8). ps [Formula 9]

$$S = G_R \times T_{2AB} = G_R \times (T_0 + t_1 \times I_{2AB}) \quad (9)$$
$$= G_R \times T_0 + G_R \times t_1 \times \{|G_A|^2 + |G_B|^2 + 2 \times |G_R|^2\} +$$
$$t_1 \times (G_A \times |G_R|^2 + G_A^* \times G_R^2) + t_1 \times$$
$$(G_B \times |G_R|^2 + G_B^* \times G_R^2)$$

In expression (9), it can be understood as shown in the following expression (10-1), expression (10-2), and expression (10-3).

[Formula 10]

$$(\text{zero-order light}) = \quad (10\text{-}1)$$
$$G_R \times T_0 + G_R \times t_1 \times \{|G_A|^2 + |G_B| + 2 \times |G_R|^2\}$$

$$(\pm \text{first-order light of object light } A) = \quad (10\text{-}2)$$
$$t_1 \times (G_A \times |G_R|^2 + G_A^* \times G_R^2)$$

$$(\pm \text{first-order light of object light } B) = \quad (10\text{-}3)$$
$$t_1 \times (G_B \times |G_R|^2 + G_B^* \times G_R^2)$$

Also, in expression (9), the term $t_1 \times (G_A \times |G_R|^2)$ represents regeneration of the object light A, while the term $t_1 \times (G_B \times |G_R|^2)$ represents regeneration of the object light B.

As mentioned above, in the double exposure method, there is no arising of a so-called noise term in the expression representing the regenerated light S. This means that there is no generation of unnecessary noise.

To compare the above-mentioned double exposure methods, explanation is given about a single exposure method using the phase shift mask. In the single exposure using the phase shift mask, the object light A in the first expose and the object light B in the second exposure as well as the reference light R, respectively, in the double exposure method are irradiated on the sensitized material by one exposure.

Consequently, the light intensity $I_{1AB}$ to be given to the sensitized material by a single exposure which uses the phase shift mask can be obtained by expression (11) as shown below.

[Formula 11]

$$I_{1AB} = |G_A + G_B + G_R|^2 \quad (11)$$
$$= |G_A|^2 + |G_B|^2 + |G_R|^2 + G_A \times G_B^* + G_A^* \times G_B +$$
$$G_A \times G_R^* + G_A^* \times G_R + G_B \times G_R^* + G_B^* \times G_R$$

The amplitude transmittance distribution $T_{1AB}$ recorded in the sensitized material by one exposure can be obtained by expression (12) as shown below.

[Formula 12]

$$T_{1AB} = T_0 + t_1 \times I_{1AB} \quad (12)$$

A light to be irradiated on the exposed object or regenerated light $S_1$ can be obtained by expression (13) below by using expression (7), expression (11), and expression (12).

[Formula 13]

$$S = G_R \times T_{1AB} \quad (13)$$
$$= G_R \times (T_0 + t_1 \times I_{1AB})$$
$$= G_R \times T_0 + G_R \times t_1 \times \{|G_A|^2 + |G_B|^2 + |G_R|^2\} + G_R \times t_1 \times$$
$$(G_A \times G_B^* + G_A^* \times G_B) + t_1 \times (G_A \times |G_R|^2 + G_A^* \times G_R^2) +$$
$$t_1 \times (G_B \times |G_R|^2 + G_B^* \times G_R^2)$$

In expression (13), it can be understood as shown in expression (14-1), expression (14-2), expression (14-3), and expression (14-4) as shown below.

[Formula 14]

$$(\text{zero-order light}) = G_R \times T_0 + G_R \times t_1 \times \{|G_A|^2 + |G_B|^2 + |G_R|^2\} \quad (14\text{-}1)$$

$$(\text{noise}) = G_R \times t_1 \times (G_A \times G_B^* + G_A^* \times G_B) \quad (14\text{-}2)$$

$$(\pm \text{first-order light of object light } A) = \quad (14\text{-}3)$$
$$t_1 \times (G_A \times |G_R|^2 + G_A^* \times G_R^2)$$

$$(\pm \text{first-order light of object light } B) = \quad (14\text{-}4)$$
$$t_1 \times (G_B \times |G_R|^2 + G_B^* \times G_R^2)$$

Also, in expression (14), the term $t_1 \times (G_A \times |G_R|_2)$ represents regeneration of the object light A, while the term $t_1 \times (G_B \times |G_R|^2)$ represents regeneration of the object light B.

As mentioned above, in a single exposure using the phase shift mask, a so-called noise term arises in the expression representing the regenerated light $S_1$. This means that an unnecessary noise is generated. With respect to this point, too, it can be understood that the method according to the present invention has an advantage over the conventional method.

The present invention can be variously modified without departing from its spirit.

What is claimed is:

1. A method for producing a hologram mask approximating the exposure produced by a non-holographic phase shifting photomask comprising:

exposing a hologram recording material to a first object light that is at least partially transmitted through a first original mask having a light transmitting screening pattern and a first reference light that is directed onto the hologram recording material wherein a first phase difference exists between the first object light and the first reference light; and exposing the hologram recording material to a second object light that is at least partially transmitted through a second original mask having a light transmitting screening pattern and a second reference light that is directed onto the hologram recording material wherein a second phase difference exists between the second object light and the second reference light, wherein the first phase difference and the second phase difference are not the same, and wherein the first and second original mask images recorded in the hologram recording material can be simultaneously replayed to produce an exposed pattern approximating an exposed pattern produced by a non-holographic phase shifting photomask.

2. A method according to claim 1, wherein one of said second object light or said second reference light is changed in phase by changing the optical path lengths from at least one of said light source to said hologram material through said second original mask or the optical path length from said light source to said hologram material not through said second original mask.

3. A method according to claim 1, wherein each of said first and second light transmitting-screening patterns includes a plurality of band-shaped light transmitting portions having predetermined width dimensions and arranged in a striped pattern, and a plurality of band-shaped light screening portions arranged between said light transmitting portions, wherein said light transmitting portions of said first original mask correspond to at least a part of an area to be screened by said light screening portions of said second original mask; and wherein the difference between said first phase difference and said second phase difference is approximately $\pi$.

4. A method according to claim 1, further comprising a diffraction efficiency changing step for causing a difference between a diffraction efficiency due to a first interference fringe to be formed in said hologram material in the first exposure step and a diffraction efficiency due to a second interference fringe to be formed in said hologram material in the second exposure step.

5. A method according to claim 4, wherein said diffraction efficiency changing step includes either a light intensity reducing step to reduce, between the original mask and the light source, the light intensity ratio of an object light to a reference light so as to be smaller than a light intensity ratio necessary for maximizing said diffraction efficiency, or an exposure energy adjusting step to adjust exposure energy to be given to said hologram material so as to be smaller than exposure energy necessary for maximizing said diffraction efficiency.

6. A method according to claim 1, wherein a pattern finally formed in said hologram material includes a striped pattern in which band-shaped light transmitting portions and light semi-transmitting portions respectively having a predetermined width dimension are alternately arranged;

wherein each of said first and second original masks has said light screening portions corresponding to said light semi-transmitting portions or said light transmitting portions corresponding to said striped pattern of said hologram material;

wherein said light transmitting portions of said first original mask correspond to at least a part of the area to be screened by said light screening portions of said second original mask;

wherein the difference between said first phase difference and said second phase difference is approximately $\pi$; and wherein a diffraction efficiency changing step to change the diffraction efficiency of said hologram material so as to be decreased at said light semi-transmitting portions is provided.

7. A method according to claim 1, wherein said hologram material has the same photosensitive film or a photosensitive layer to be used in both of said first and second exposure steps formed thereon.

8. A method according to claim 1, wherein said hologram material has different photosensitive films or photosensitive layers to be used respectively in said first and second exposure steps formed thereon.

* * * * *